Figure 1:
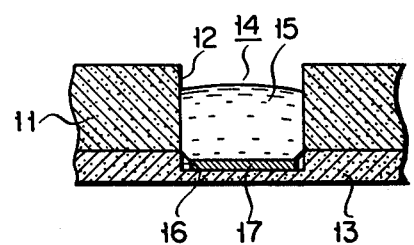

United States Patent [19]

Naito et al.

[11] 4,180,423

[45] Dec. 25, 1979

[54] METHOD OF MANUFACTURING RED LIGHT-EMITTING GALLIUM PHOSPHIDE DEVICE

[75] Inventors: Makoto Naito, Kamakura; Akinobu Kasami, Yokohama, both of Japan

[73] Assignee: Tokyo Shibaura Electric Co., Ltd., Kawasaki, Japan

[21] Appl. No.: 717,505

[22] Filed: Aug. 24, 1976

Related U.S. Application Data

[63] Continuation-in-part of Ser. No. 514,747, Oct. 15, 1974, abandoned.

[30] Foreign Application Priority Data

Jan. 31, 1974 [JP] Japan ................... 49-12218
Jan. 31, 1974 [JP] Japan ................... 49-12219

[51] Int. Cl.$^2$ ........................... H01L 33/00
[52] U.S. Cl. ................... 148/171; 148/172; 357/17
[58] Field of Search ........... 148/171, 172; 357/17

[56] References Cited

U.S. PATENT DOCUMENTS

| | | | |
|---|---|---|---|
| 3,549,401 | 12/1970 | Buszko | 357/17 |
| 3,603,833 | 9/1971 | Logan | 357/17 |
| 3,703,671 | 11/1972 | Saul | 357/17 |
| 3,715,245 | 2/1973 | Barnett | 357/17 |
| 3,934,260 | 1/1976 | Kasami et al. | 357/64 |
| 3,951,699 | 4/1976 | Nuito et al. | 148/171 |
| 3,951,700 | 4/1976 | Bepph et al. | 148/171 |
| 4,017,880 | 4/1977 | Kasami et al. | 357/17 |

FOREIGN PATENT DOCUMENTS

2449905 8/1975 Fed. Rep. of Germany ............. 357/15

OTHER PUBLICATIONS

Saul, J. Electrochemical Soc. (7-1970), *Distribution* . . . *Liquid Phase Epitaxy Layers,* pp. 921–924 (vol. 117, No. 7).
Saul, Applied Physics Letters, vol. 15, No. 7, (10-1969) pp. 229–231, *GaP . . . Efficiency of 7%.*
Mizuta, Japan J. Appl. Physics, *New Junction . . . GaP . . . Diodes* pp. 1631–1632 (vol. 14, No. 10) Oct. 1975.
Kukimuto et al., *Physical Review, Photocapacitance . . . Concentration,* vol. 7, No. 6 (3-1973) pp. 2486–2499.
Hackett et al., "Scanning Electron Microscope Characterization of GaP Red-Emitting Diodes" J. Applied Physics, vol. 43, No. 6, Jun. 1972.
Ralston, "Detailed Light–Current–Voltage Analysis of GaP Electroluminescent Diodes", J. Applied Physics, vol. 44, No. 6, Jun. 1973.
Takanashi et al., "GaP Liquid Phase Epitaxial Growth and Light Emitting Diodes III–GaP Red Light Emitting Diodes", Fujitsu Scientific & Tech. Journal, Sep. 1973.

*Primary Examiner*—Harris A. Pitlick
*Attorney, Agent, or Firm*—Oblon, Fisher, Spivak, McClelland & Maier

[57] ABSTRACT

A red light-emitting gallium phosphide device of high electroluminescent efficiency which comprises an n-type gallium phosphide substrate containing a donor at concentrations ranging from $1 \times 10^{17}$ cm$^{-3}$ to $3 \times 10^{17}$ cm$^{-3}$, an n-type gallium phosphide layer formed on said substrate with a donor concentration in the neighborhood of a p-n junction set at a level ranging from $2 \times 10^{17}$ cm$^{-3}$ to $5.5 \times 10^{17}$ cm$^{-3}$ and a p-type gallium phosphide layer grown on said n-type gallium phosphide layer with a net acceptor concentration and an oxygen donor concentration in the neighborhood of the p-n junction chosen to range from $1 \times 10^{17}$ cm$^{-3}$ to $3 \times 10^{17}$ cm$^{-3}$ and $0.1 \times 10^{16}$ cm$^{-3}$ to $8 \times 10^{16}$ cm$^{-3}$, respectively.

4 Claims, 7 Drawing Figures

METHOD OF MANUFACTURING RED LIGHT-EMITTING GALLIUM PHOSPHIDE DEVICE

CROSS-REFERENCE TO RELATED APPLICATION

This is a continuation-in-part application of U.S. Patent application Ser. No. 514,747 filed on Oct. 15, 1974, now abandoned.

This invention relates to a method of manufacturing a gallium phosphide (GaP) device emitting red light with high electroluminescent efficiency.

It has been disclosed that a red light-emitting gallium phosphide device or element generates said red light in the p region adjacent to the p-n junction and that the luminescent center of the red light consists of zinc (Zn)-oxygen (O) pairs. For elevation of luminescent efficiency, therefore, it required, first, to introduce a large amount of electrons into the p region, namely, increase a donor concentration $N_D$ in the n region over an acceptor concentration $N_A$ in the p region. (It will be noted that the donor and acceptor concentrations, as used herein, are defined to mean the donor and acceptor concentration in a semiconductor element and distinguished from a carrier concentration.), secondly, to increase concentrations of Zn-O pairs in the p region and, thirdly, to decrease as much as possible non-radiative recombination centers in the p region.

It is known that the above-mentioned n region should preferably comprise an n-type GaP substrate formed of a GaP crystal prepared by the liquid-encapsulated Czochralski method (hereinafter referred to as an "LEC" crystal) and an n-type GaP layer mounted on said substrate by liquid phase epitaxial growth and that the aforesaid p region is desired to be a p-type GaP layer superposed on said n-type GaP layer similarly by liquid phase epitaxial growth.

It has been experimentally confirmed that to meet the above-mentioned requirements, the optimum acceptor concentration $N_A$ in the p-type layer should be chosen to range between $3 \times 10^{17}$ cm$^{-3}$ and $6 \times 10^{17}$ cm$^{-3}$, and that to satisfy the aforedaid first condition of $N_D > N_A$, the donor concentration $N_D$ in the n-type layer should be so controlled as to amount to $8 \times 10^{17}$ cm$^{-3}$ or over.

The donor concentration in the n-type GaP substrate has hitherto been chosen to approximate the donor concentration in the n-type GaP layer. Further, where the p-type GaP layer is formed by liquid phase epitaxial growth, the required epitaxial solution has been cooled at an appreciably fast rate of 10° C./min or quicker in order to introduce as much oxygen as possible into said p-type GaP layer. And the n-type GaP layer has been grown by cooling the required epitaxial solution at the rate of 5° C. to 10° C. per minute. However, the above-mentioned prior art red light-emitting GaP device had an electroluminescent efficiency of about 2 to 3% and failed to display a higher level of said efficiency than 4% with prominent reproducibility.

It is accordingly the object of this invention to provide a method of manufacturing a red light-emitting gallium phosphide device capable of displaying high electroluminescent efficiency, particularly higher external quantum efficiency than 4% with prominent reproducibility.

The red light-emitting gallium phosphide device manufactured by this invention is characteristically formed of an n-type GaP substrate containing a donor at a concentration ranging from $1 \times 10^{17}$ cm$^{-3}$ to $3 \times 10^{17}$ cm$^{-3}$, preferably, $1.6 \times 10^{17}$ cm$^{-3}$ to $2.5 \times 10^{17}$ cm$^{-3}$; an n-type GaP layer grown on said substrate with a donor concentration in the neighborhood of the p-n junction chosen to range between $2 \times 10^{17}$ cm$^{-3}$ and $5.5 \times 10^{17}$ cm$^{-3}$, preferably, $3 \times 10^{17}$ cm$^{-3}$ and $5 \times 10^{17}$ cm$^{-3}$; and a p-type GaP layer superposed on said n-type GaP layer with an acceptor concentration in the neighborhood of the p-n junction set at a level ranging from $1 \times 10^{17}$ cm$^{-3}$ to $3 \times 10^{17}$ cm$^{-3}$, preferably, $1.6 \times 10^{17}$ cm$^{-3}$ to $2.5 \times 10^{17}$ cm$^{-3}$. According to this invention, the above-mentioned p-type GaP layer or both p-type and n-type GaP layers are formed by liquid phase epitaxial growth by cooling the required epitaxial solution at a slower rate than 3° C./min (not including 0° C./min).

Figure 2:
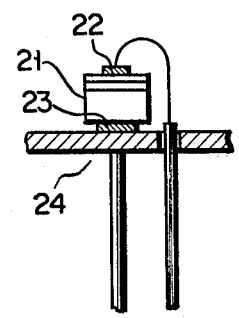
Figure 3:
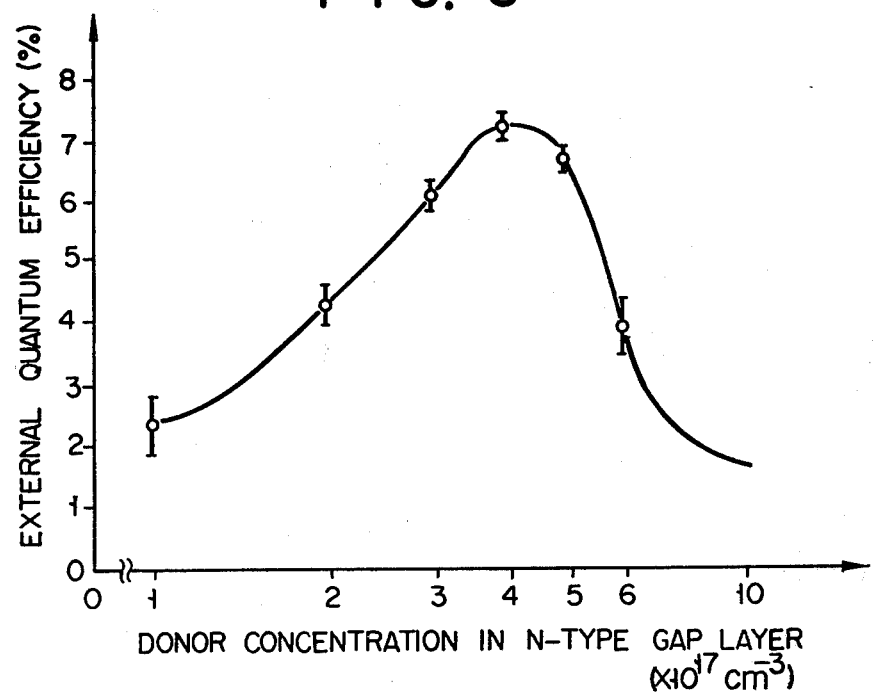
Figure 4:
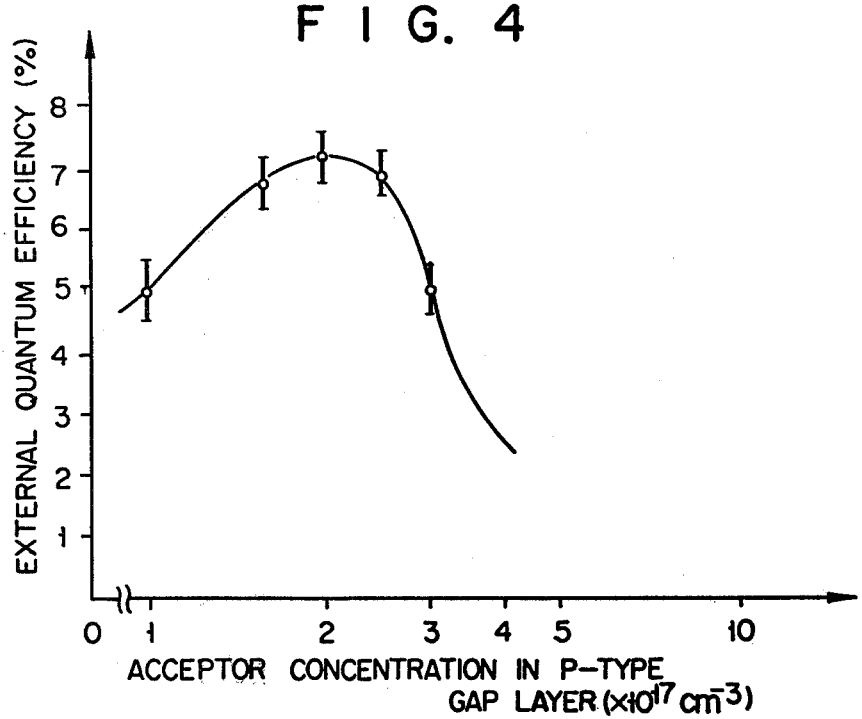
Figure 5:
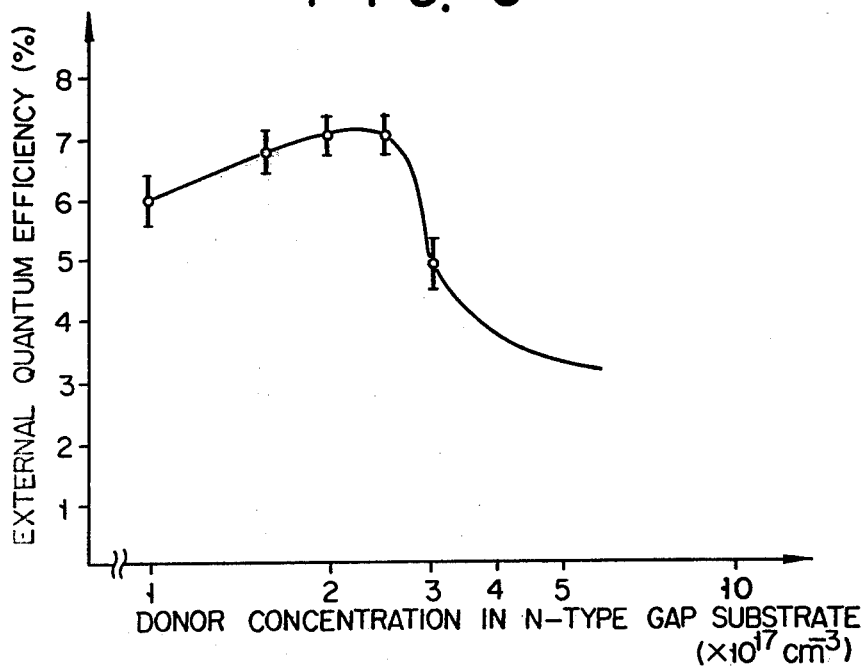
Figure 6:
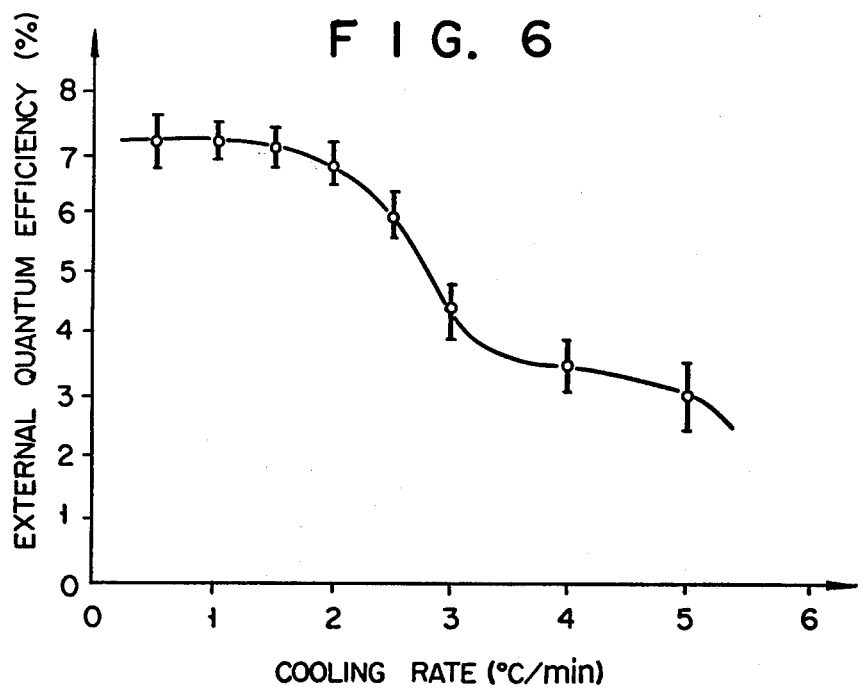

This invention can be more fully understood from the following detailed description when taken in conjunction with the accompanying drawings, in which:

FIG. 1 schematically illustrates the cross section of the main part of an apparatus used in the liquid phase epitaxial process;

FIG. 2 shows the construction of a red light-emitting GaP diode according to this invention;

FIG. 3 graphically indicates a relationship between a donor concentration in the n-type GaP layer and the external quantum efficiency of the corresponding GaP device;

FIG. 4 graphically presents a relationship between an acceptor concentration in the p-type GaP layer and the external quantum efficiency of the corresponding GaP device;

FIG. 5 graphically sets forth a relationship between a donor concentration in the n-type GaP substrate and the external quantum efficiency of the corresponding GaP device;

FIG. 6 graphically illustrates a relationship between the rate at which the required epitaxial solution is cooled for the liquid phase epitaxial growth of the p-type GaP layer and the external quantum efficiency of the corresponding GaP device.

This invention will be more fully understood from the examples which follow.

EXAMPLE 1

FIG. 1 is a schematic cross sectional view of a slide type apparatus for growing an n-type gallium phosphide layer and a p-type gallium phosphide layer on an n-type gallium phosphide substrate according to the principle of the liquid phase epitaxial growth process. Referential numeral 11 denotes the body of said apparatus made of carbon. The body 11 is bored with a vertically penetrating cylindrical hole 12, and has a separate carbon bottom plate 13 positioned close to the underside of the body 11, and designed to slide horizontally so as to close the vertical hole 12. Therefore, the bottom plate 13 and vertical hole 12 jointly constitute a chamber 14 open at the top in the apparatus body 11. The chamber 14 is filled with an epitaxial solution 15 of gallium phosphide containing n- or p-type impurities. Part of the upper surface of the bottom plate 13 is provided with a circular recess 16 whose diameter is substantially equal to that of the vertical hole 12, said recess 16 being used to receive a substrate 17 of gallium phosphide. When, therefore, the bottom plate 13 is so moved as to bring the recess 16 right under the vertical hole 12, then the upper surface of the gallium phosphide substrate 17 touches the gallium phosphide epitaxial solution 15.

There will now be described by way of illustration the method of preparing a red light-emitting gallium phosphide diode using the slide type apparatus constructed as described above.

A single crystal of Te-doped n-type gallium phosphide with a donor concentration of $2 \times 10^{17}$ cm$^{-3}$ was prepared. A 300-micron thick substrate cut out from said single crystal was placed in the recess 16 of the bottom plate 13 with the (111)B plane of said crystal kept at the top. The chamber 14 was charged with 40 g of a gallium solution containing 5 g of polycrystalline gallium phosphide and 8 mg of tellurium (Te). The apparatus thus loaded was heated 30 minutes at 1050° C. in an open-type electric furnace to homogenize the gallium solution. The bottom plate 13 was made to slide horizontally so as to bring the upper surface of the substrate 17 into contact with the tellurium-containing gallium solution as shown in FIG. 1. Cooling was carried out at the rate of 2° C. per minute for the growth of an n-type gallium phosphide layer on the substrate 17, the thickness of said n-type layer ranging between 60 and 70 microns. The control of the cooling rate is continued until the temperature within the furnace is lowered to about 900° C. from 1050° C. Thereafter the cooling treatment is made at a suitable rate such as 5° C./min or more. The n-type gallium phosphide layer was lapped out to have a thickness of 20 microns and a thin layer of gold was deposited by evaporation on the surface of the remainder of said n-type gallium phosphide layer to provide a Schottky barrier. Measurement was made of the electric capacitance of said Schottky barrier. When calculated from the electric capacitance, the donor concentration $N_D$ at the upper surface of the n-type gallium phosphide layer was found to be $4 \times 10^{17}$ cm$^{-3}$. After the gold layer was removed from the upper surface of the n-type gallium phosphide layer, a p-type gallium phosphide layer was grown on the n-type gallium phosphide layer as follows. The chamber 14 was charged with 40 g of a gallium solution containing 5 g of polycrystalline gallium phosphide, 0.5 g (about 0.47 mol percent) of gallium oxide (Ga$_2$O$_3$), and 10 mg of zinc (Zn). The mixing rate of gallium oxide may preferably be 0.4 to 0.6 mol percent. The apparatus thus loaded was heated 30 minutes at 1050° C. in an open-type electric furnace to homogenize the gallium solution. The bottom plate 13 was made to slide horizontally so as to bring the upper surface of the n-type layer grown on the substrate 17 into contact with the zinc containing gallium solution.

While Ar gas was made to flow through the furnace, the solution in the chamber 14 was cooled to about 900° C. from 1050° C. at a cooling rate of 2° C./min and then further cooled at the cooling rate of more than 5° C./min, so that a p-type gallium phosphide layer of 60 to 70 microns thick is grown onto the n-type layer.

The surface of the p-type GaP layer lapped with about 20µ portion thereof left out, and a gold film was evaporated on said lapped surface, thereby providing a Schottky barrier as in the liquid phase epitaxial growth of the n-type GaP layer. When measurement was made of the electric capacitance of said Schottky barrier, the net acceptor concentration $N_A$ and oxygen or donor concentration $N_D$ in said layer at a point about 20 microns apart from the p-n junction was $2 \times 10^{17}$ cm$^{-3}$ and $0.15 \times 10^{16}$ cm$^{-3}$, respectively. The substrate was lapped to reduce the entire thickness of said wafer to about 200 microns. The substrate side of said wafer was fitted with an electrode of indium (In) and the p-type GaP layer with an electrode of indium (In)-zinc (Zn) alloy. The means was sintered at about 500° C. for ten minutes to form an ohmic electrode. The gold film deposited on the p-type GaP layer was removed before preparing said ohmic electrode. The wafer obtained was cut up in a number of rectangular parallelpiped chips having a square cross section, each side of which measured 1 mm. Each chip thus cut was mounted on a TO-18 header with the p-type GaP layer disposed at the top, providing a GaP diode shown in FIG. 2, in which referential numeral 21 denotes a diode chip, 22, 23 represent ohmic electrodes and 24 shows a stem. When supplied with 2 mA current in the forward direction, the GaP diode emitted a red light. In this case, the GaP diode which was not coated with epoxy resin indicated external quantum efficiency of 7% on the average. When coated with said epoxy resin, the GaP diode displayed as high external quantum efficiency as 10%, a level which has not been attained in the past.

It is generally known that the distribution of the net acceptor concentration and oxygen concentration in that part of the p-type GaP layer which is initially formed by liquid phase epitaxial growth, namely, the portion extending outward about 20 microns from the p-n junction have a slow gradient. Therefore, substantially the same net acceptor concentration and oxygen concentration occur in the portion of the p-type GaP layer close to the p-n junction and the portion of said GaP layer about 20 microns apart from said p-n junction.

EXAMPLE 2

Substantially the same process as in Example 1 was followed, excepting that the n-type GaP layers of a plurality of GaP diode samples had the donor concentrations $N_D$ at the p-n junction set at $1 \times 10^{17}$ cm$^{-3}$, $2 \times 10^{17}$ cm$^{-3}$, $3 \times 10^{17}$ cm$^{-3}$, $5 \times 10^{17}$ cm$^{-3}$ and $6 \times 10^{17}$ cm$^{-3}$ respectively by varying the content of tellurium (Te) in the n-type epitaxial solution. Various forms of GaP diode thus prepared were supplied with 2 mA current in the forward direction to measure the electroluminescent efficiencies of said diodes. As shown in FIG. 3, the various levels of external quantum efficiency $\eta$ (without the coating of epoxy resin) corresponding to the above-mentioned different tellurium donor concentrations $N_D$ indicated 2.3%, 4.3%, 6.0% and 3.8% respectively. The marks of circles on the curve of FIG. 3 respectively indicate the average value of the external quantum efficiency $\eta$ of each of the corresponding samples. The upper and lower ends of upright lines extending parallel with the ordinate line through said marks of circles represent the maximum and minimum values of the external quantum efficiency $\eta$ of each of the corresponding samples. Referring to the curve of FIG. 3, the data of $\eta = 7\%$ corresponding to $N_D = 4 \times 10^{17}$ cm$^{-3}$ represents the result of determination obtained in Example 1. As seen from FIG. 3, higher external quantum efficiency $\eta$ than 4% was obtained (without the coating of epoxy resin), while a donor concentration $N_D$ in the n-type layer remained at a level substantially ranging from $2 \times 10^{17}$ cm$^{-3}$ to $5.5 \times 10^{17}$ cm$^{-3}$. The reason why the external quantum efficiency $\eta$ falls to below 4% when the donor concentration $N_D$ increases over $5.5 \times 10^{17}$ cm$^{-3}$ is assumed to originate with the facts that increased donor concentration leads to the low crystalline perfection of the n-type GaP layer itself; the appearance of a larger number of nonradiative recombination centers in said n-type GaP layer more reduces the injection of electrons from said n-type GaP layer to the p-type GaP layer; and the resultant low crystalline perfection of the p-type GaP layer grown on the n-type GaP layer gives rise to the occurrence of many lattice defects forming nonradiative recombination centers in said p-type GaP layer. Further, the reason why the external quantum efficiency $\eta$ also drops when the donor concentration $N_D$ in the n-type GaP layer is less than $2\times 10^{17}$ cm$^{-3}$ is supposed to arise from the fact that a smaller donor concentration in the n-type GaP layer than an acceptor concentration in the p-type GaP layer restricts the injection of electrons from the n-type to the p-type GaP layer. Though it may be considered advisable to control the acceptor concentration in the p-type GaP layer to a low level, for example, to about $5\times 10^{16}$ cm$^{-3}$ if the donor concentration in the n-type GaP layer is lower than $1\times 10^{17}$ cm$^{-3}$ in order to cause a larger amount of electrons to be conducted from the n-type to the p-type GaP layer, yet this procedure is not preferred, because the reduced acceptor concentration in the p-type GaP layer leads to the decreased concentration in said p-type GaP layer of Zn-O pairs constituting luminescent centers with the resultant decline in the external quantum efficiency $\eta$ of a red light-emitting GaP device. Moreover, it seems difficult for the present day technique to control the acceptor concentration in the p-type GaP layer to about $5\times 10^{16}$ cm$^{-3}$ or to a lower level.

EXAMPLE 3

Substantially the same process as in Example 1 was followed, excepting that a plurality of GaP diode samples used had different acceptor concentrations ($1\times 10^{17}$ cm$^{-3}$, $1.6\times 10^{17}$ cm$^{-3}$, $2.5\times 10^{17}$ cm$^{-3}$, $3\times 10^{17}$ cm$^{-3}$). The results of determination obtained in this Example 3 are set forth in FIG. 4, which shows that higher external quantum efficiency than 4% was attained when the acceptor concentration in the p-type GaP layer substantially ranged from $1\times 10^{17}$ cm$^{-3}$ to $3\times 10^{17}$ cm$^{-3}$. The reason why said external quantum efficiency of the diode formed by such a process falls to below 4% when the acceptor concentration in the p-type GaP layer exceeds $3\times 10^{17}$ cm$^{-3}$ is that higher acceptor concentration leads to the reduced crystalline perfection of the p-type GaP layer itself and in consequence the occurrence of a larger number of nonradiative recombination centers.

For elevation of the external quantum efficiency, it is preferred that the relationship between the donor concentration $N_D$ in the n-type GaP layer and the acceptor concentration $N_A$ in the p-type GaP layer be so controlled as to be $N_D > N_A$. It has been experimentally disclosed that the relationship of $4N_A \geq N_D \geq 1.5 N_A$ is particularly desired to obtain a red light-emitting GaP device capable of displaying high electroluminescent efficiency. Namely, the relationship of $N_D \geq N_A$ substantially obstructs the transfer of electrons from the n-type to the p-type GaP layer and even the relationship of $N_D < 1.5 N_A$ restricts said transfer, probably failing to provide a red light-emitting GaP device of high external quantum efficiency. On the other hand, the relationship of $N_D \geq 1.5 N_A$ causes a larger amount of electrons to be introduced from the n-type into the p-type GaP layer, possibly elevating said external quantum efficiency. The relationship of $N_D > 4.0 N_A$ leads to the more prominent supply of electrons from the n-type to the p-type GaP layer and should, as naturally expected, increase said external quantum efficiency, but in fact conversely decreases it. This drop in the external quantum efficiency is assumed to originate with the fact that a large difference between the donor concentration $N_D$ in the n-type GaP layer and the acceptor concentration $N_A$ in the p-type GaP layer presents difficulties in controlling the acceptor concentration of the p-type GaP layer grown on the n-type GaP layer.

EXAMPLE 4

Substantially the same process as in Example 1 was followed, excepting that the GaP diode samples used had different donor concentrations ($1\times 10^{17}$ cm$^{-3}$, $1.6\times 10^{17}$ cm$^{-3}$, $3\times 10^{17}$ cm$^{-3}$) in the respective n-type GaP substrates. The data obtained in this Example 4 are indicated in FIG. 5, which shows that when the donor concentration in each n-type GaP substrate remained at a level substantially ranging from $1\times 10^{17}$ cm$^{-3}$ to $3\times 10^{17}$ cm$^{-3}$, the resultant external quantum efficiency was higher than 4% (without the coating of epoxy resin). A lower donor concentration than $1\times 10^{17}$ cm$^{-3}$ in the above-mentioned substrate presented difficulties in rendering the electrode on said substrate fully ohmic as in the case of the p-type GaP layer. Even though said electrode may be made ohmic, resistance will arise in the junction between the substrate and said electrode, making it necessary to apply higher operating voltage, namely, substantially decreasing the external quantum efficiency of the resultant red lightemitting GaP device. When the donor concentration in the n-type substrate exceeds $3\times 10^{17}$ cm$^{-3}$, then the crystalline perfection of said substrate is disturbed. This disturbance in the crystalline perfection of the n-type substrate adversely affects the n-type GaP layer grown on the substrate and the p-type GaP layer formed on said n-type GaP layer, thereby reducing the crystalline perfection of the radiative region near the p-n junction and in consequence the external quantum efficiency.

EXAMPLE 5

Substantially the same process as in Example 1 was followed, excepting that the p-type GaP layers of a plurality of GaP diode samples were formed by liquid phase epitaxial growth with the required epitaxial solution cooled at different rates each time. Data obtained in this Example 5 are given in FIG. 6, which shows that when the cooling rate was slower than 3° C./min, a GaP diode obtained had higher external quantum efficiency ($\eta$) than 4%. The zero growth of an epitaxial layer at the cooling rate of 0° C./min is not adopted in this invention. The cooling rate, therefore, is preferred to range between 0.2° and 3° C./min. A slower cooling rate than 0.2° C./min also attains the higher crystalline perfection of the p-type layer and in consequence elevates the electroluminescent efficiency of the resultant GaP diode, but presents difficulties in controlling the temperature in a liquid phase epitaxial growth apparatus, and is unadapted for quantity production due to unduly long time being consumed in the liquid phase epitaxial growth of said p-type GaP layer. The decreased external quantum efficiency ($\eta$) at a faster cooling rate than 3° C./min is supposed to arise from the fact that such quick cooling rate gives rise to the lower crystalline perfection of the p-type GaP layer and in consequence the more prominent appearance of nonradiative recombination centers.

Substantially the same process as in Example 1 was further followed, excepting that the n-type GaP layers of a plurality of GaP diode samples were formed by liquid phase epitaxial growth with the required epitaxial solution cooled at different rates each time. As in the above-mentioned p-type GaP layer, a slower cooling rate than 3° C./min realized higher external quantum efficiency than 4%.

As above described, the reason why a higher crystalline perfection is obtained when the p-type gallium phosphide layer is subject to liquid phase growth at a cooling rate of 3° C./min or less is that no distortion occurs in the crystal due to heat; and the p-type layer is not doped with a large amount of oxygen. The latter reason is based on the fact that when the oxygen donor concentration is increased up to a value more than $8 \times 10^{16}$ cm$^{-3}$, the crystal is rapidly damaged owing to the action of the oxygen. But when the oxygen donor concentration is decreased down to a value less than $0.1 \times 10^{16}$ cm$^{-3}$, the amount of recombination centers generated is reduced to an extreme extent, failing to obtain a desired light emitting efficiency. Where, accordingly, it is desired to obtain an oxygen concentration of $0.1 \times 10^{16}$ cm$^{-3}$ or more, it has turned out according to the experiments that in this embodiment the cooling rate should be set to a value equal to or more than 0.2° C./min. Namely, when the cooling rate is chosen to range from 0.2° and 3° C./min, whe light emitting efficiency can be enhanced by reducing the influences of heat and oxygen on the crystal, namely the distortion thereof due to heat and the action thereon of oxygen. Except that the oxygen concentration of the p-type layer is chosen to be $0.1 \times 10^{16}$ cm$^{-3}$, $0.2 \times 10^{16}$ cm$^{-3}$, $0.3 \times 10^{16}$ cm$^3$, $0.5 \times 10^{16}$ cm$^{-3}$, $1 \times 10^{16}$ cm$^3$, $2 \times 10^{16}$ cm$^{-3}$, $4 \times 10^{16}$ cm$^{-3}$, $6 \times 10^{16}$ cm$^{-3}$ and $8 \times 10^{16}$ cm$^{-3}$, diodes were prepared in the same manner as in Example 1, and the light emitting efficiency thereof was measured. When the oxygen concentration falls within the range of 0.1 to $8 \times 10^{16}$ cm$^{-3}$, a light emitting efficiency of 4% or more is obtained; and especially in the range of 0.2 to $4 \times 10^{16}$ cm$^{-3}$, a higher light emitting efficiency is obtained. Where it is desired to obtain an oxygen concentration of such range, the cooling rate has only to be set to 3° C./min or less.

In all the foregoing examples, the liquid phase epitaxial layer was grown for an initial time at a slower cooling rate than 3° C./min namely at a cooling late of 2° C./min. However, it is possible to form the p-type and n-type epitaxial layers for a whole time at the aforementioned cooling rate.

As previously described, one of the conventional processes of elevating the electroluminescent efficiency of a GaP diode was to apply a quicker cooling rate than, for example 10° C./min in the liquid phase epitaxial growth of the p-type GaP layer in order to increase the content of Zn-O pairs in said p-type GaP layer. In contrast, the present invention causes the p-type GaP layer or both p-type GaP layer and n-type GaP layer mounted thereon to be formed by liquid phase epitaxial growth with the required epitaxial solution cooled at a slower rate than 3° C./min, thereby attaining the higher external quantum efficiency ($\eta$) than 4%. In this case, however, it is necessary to choose the donor concentration in the n-type GaP substrate to range between $1 \times 10^{17}$ cm$^{-3}$ and $3 \times 10^{17}$ cm$^{-3}$, the donor concentration in the n-type GaP layer between $2 \times 10^{17}$ cm$^{-3}$ and $5.5 \times 10^{17}$ cm$^{-3}$ and the acceptor concentration in the p-type GaP layer superposed on said n-type layer between $1 \times 10^{17}$ cm$^{-3}$ and $3 \times 10^{17}$ cm$^{-3}$.

Throughout the foregoing examples, tellurium was doped as a donor impurity in the n-type GaP substrate and n-type GaP layer. However, the tellurium may be replaced by other donor impurities such as sulphur and selenium.

Throughout this specification, the term "net acceptor concentration $N_A$" means the concentration of an acceptor in the p-type gallium phosphide to which there is added the remainder of a p-type impurity acceptor such as zinc obtained by subtracting the concentration $N_D$ of oxygen or donor.

What we claim is:

1. A method of manufacturing a red light-emitting gallium phosphide device comprising the steps of forming by liquid phase epitaxial growth an n-type gallium phosphide layer whose donor concentration at the p-n junction ranges between $2 \times 10^{17}$ cm$^{-3}$ and $5.5 \times 10^{17}$ cm$^{-3}$ on an n-type gallium phosphide substrate whose donor concentration ranges between $1 \times 10^{17}$ cm$^{-3}$ and $3 \times 10^{17}$ cm$^{-3}$: and forming by liquid phase epitaxial growth of a cooling rate ranging between 0.2° and 3° C./min. a p-type gallium phosphide layer whose net acceptor concentration ranges between $1 \times 10^{17}$ cm$^{-3}$ and $3 \times 10^{17}$ cm$^{-3}$ in the portion at a distance of not more than 20 microns from the p-n junction.

2. A method of manufacturing a red light-emitting gallium phosphide device according to claim 1 wherein the n-type gallium phosphide layer is formed by liquid phase epitaxial growth of a cooling rate ranging between 0.2° and 3° C./min.

3. A method of manufacturing a red light-emitting gallium phosphide device according to claim 1 wherein the liquid phase epitaxial growth is made at a cooling rate of 0.2° to 3° C./min until 900° C. from more than 1000° C. and then at a cooling rate of more than 3° C./min.

4. A method of manufacturing a red light-emitting gallium phosphide device according to claim 1, wherein the donor concentration $N_D$ of the n-type gallium phosphide layer and the acceptor concentration $N_A$ in the p-type gallium phosphide layer have a relationship expressed by the formula:

$$4N_A \geq N_D \geq 1.5N_A.$$

* * * * *